(12) United States Patent
Wang et al.

(10) Patent No.: US 11,827,997 B2
(45) Date of Patent: Nov. 28, 2023

(54) STRIPPING METHOD AND STRIPPING DEVICE FOR SILICON CARBIDE SINGLE CRYSTAL WAFERS

(71) Applicant: ZJU—Hangzhou Global Scientific and Technological Innovation Center, Hangzhou (CN)

(72) Inventors: Rong Wang, Hangzhou (CN); Wenhao Geng, Hangzhou (CN); Xiaodong Pi, Hangzhou (CN); Deren Yang, Hangzhou (CN)

(73) Assignee: ZJU-Hangzhou Global Scientific and Technological Innovation Center, Hangzhou (CN)

( * ) Notice: Subject to any disclaimer, the term of this patent is extended or adjusted under 35 U.S.C. 154(b) by 0 days.

(21) Appl. No.: 17/986,932

(22) Filed: Nov. 15, 2022

(65) Prior Publication Data

US 2023/0076324 A1   Mar. 9, 2023

(30) Foreign Application Priority Data

Nov. 15, 2021   (CN) .......................... 202111344971.4
Dec. 8, 2021    (CN) .......................... 202111490083.3

(51) Int. Cl.
*C25F 3/12*   (2006.01)
*C30B 33/10*  (2006.01)
*C30B 29/36*  (2006.01)

(52) U.S. Cl.
CPC ............... *C25F 3/12* (2013.01); *C30B 29/36* (2013.01); *C30B 33/10* (2013.01)

(58) Field of Classification Search
CPC .................................. C25F 3/12; C30B 29/36
See application file for complete search history.

(56) References Cited

U.S. PATENT DOCUMENTS

| 5,690,807 A | * | 11/1997 | Clark, Jr. | ................. | C25F 3/12 |
| | | | | | 205/684 |
| 2007/0209577 A1 | | 9/2007 | Powell et al. | | |
| 2017/0159208 A1 | | 6/2017 | Aigo et al. | | |
| 2022/0189768 A1 | | 6/2022 | Khlebnikov et al. | | |

OTHER PUBLICATIONS

CN 111020673 A—see translation (Year: 2020).*
CN 112404735 A—see translation (Year: 2021).*

* cited by examiner

*Primary Examiner* — Nicholas A Smith
(74) *Attorney, Agent, or Firm* — Zhigang Ma (57) ABSTRACT

The present disclosure relates to the field of manufacturing of silicon carbide (SiC) single crystal wafers, and discloses a stripping method and a stripping device for SiC single crystal wafers. The single crystal wafers obtained by the present disclosure have no damage layer or stress residue on surfaces or sub-surfaces, and are simple in operation and low in cost.

6 Claims, 5 Drawing Sheets

S10 — Provide a semi-insulating SiC crystal ingot, and immerse the semi-insulating SiC crystal ingot in an etching solution, wherein the semi-insulating SiC crystal ingot includes an amorphous layer and a single crystal layer located on a surface of the amorphous layer, and the amorphous layer is located at a predetermined depth inside the semi-insulating SiC crystal ingot;

S20 — Irradiate the semi-insulating SiC crystal ingot with incident light with a specific wavelength, wherein the incident light passes through the single crystal layer on the surface of the semi-insulating SiC crystal ingot and irradiates on surfaces of the amorphous layer to form photo-generated hole-electron pairs on the surfaces of the amorphous layer;

S30 — Selectively etch the surfaces of the amorphous layer provided with the photo-generated hole-electron pairs by the etching solution during irradiation, thereby stripping the single crystal layer and obtaining a semi-insulating SiC single crystal wafer.

STRIPPING METHOD AND STRIPPING DEVICE FOR SILICON CARBIDE SINGLE CRYSTAL WAFERS

TECHNICAL FIELD

The present disclosure relates to the technical field of manufacturing of single crystal wafers, in particular to a stripping method and a stripping device for silicon carbide (SiC) single crystal wafers.

BACKGROUND ART

At present, in the process of slicing an SiC crystal ingot, a "laser cutting method" is a novel method for producing SiC single crystal wafers and is expected to replace the traditional "diamond wire cutting method". In a dry environment, laser is focused on a cut surface parallel to a base surface of the SiC crystal ingot; high-density dislocations are generated by local heating; and a thin amorphous layer mixed with amorphous silicon, amorphous carbon and amorphous SiC is formed at a predetermined depth of the SiC crystal ingot, wherein the thickness of the amorphous layer is about 50 μm; and then the SiC single crystal wafers are obtained by mechanically stripping the amorphous layer.

The method has advantages of fewer cutting losses and fewer machining marks on surfaces or sub-surfaces of the wafer, and can significantly reduce the difficulty of a next grinding process. However, an internal structure of the amorphous layer obtained by laser treatment is not uniform, so that the SiC single crystal wafers are possible to crack during mechanical stripping due to uneven stress; and the surfaces of the stripped SiC single crystal wafers will have residual stress, which is not conducive to the next machining. So far, the sizes of SiC crystal ingots obtained by the "laser cutting method" are all relatively small (<1 cm×1 cm), which cannot meet production requirements of 2-8 inch n-type SiC single crystal wafers.

SUMMARY OF THE INVENTION

Purposes of the present disclosure are to overcome a problem of poor effect of the existing stripping method, and provide a stripping method and a stripping device for SiC single crystal wafers.

To achieve the above purposes, the present disclosure provides a stripping method for SiC single crystal wafers, including:
  providing an n-type SiC crystal ingot, wherein the n-type SiC crystal ingot includes an amorphous layer and single crystal layers located on surfaces of the amorphous layer, and the amorphous layer is located at a predetermined depth inside the n-type SiC crystal ingot;
  immersing the n-type SiC crystal ingot in an etching solution, taking the n-type SiC crystal ingot as an anode and arranging a cathode and a reference electrode in the etching solution based on a three-electrode system, wherein the etching solution contains an oxidant and a silicon oxide etching solution; irradiating the surface of the n-type SiC crystal ingot with incident light greater than a critical wavelength of absorbed light corresponding to the single crystal layers, wherein the incident light passes through the single crystal layers on the surface of the n-type SiC crystal ingot and irradiates on the surfaces of the amorphous layer to form photo-generated hole-electron pairs on the surfaces of the amorphous layer;
  providing a positive constant potential to the n-type SiC crystal ingot during irradiation, transferring photo-generated electrons on the surfaces of the amorphous layer to the cathode along current to react with the oxidant, and selectively etching the surfaces of the amorphous layer provided with photo-generated holes by the silicon oxide etching solution, thereby stripping the single crystal layers and obtaining n-type SiC single crystal wafers.

Correspondingly, the present disclosure further provides a stripping device for SiC single crystal wafers, including an electrolytic cell and a light source.

The electrolytic cell is used for containing an etching solution; an installation structure is arranged in the etching solution; the installation structure is used for installing an n-type SiC crystal ingot, and a reference electrode and a cathode in a three-electrode system; one end of the n-type SiC crystal ingot and one end of the reference electrode are respectively connected with a voltage output end; the cathode is connected with a voltage input end, wherein the n-type SiC crystal ingot includes an amorphous layer and single crystal layers located on surfaces of the amorphous layer; the amorphous layer is located at a predetermined depth inside the n-type SiC crystal ingot; and the etching solution contains an oxidant and a silicon oxide etching solution.

The light source is arranged at a predetermined position above the surface of the etching solution; the incident light, which is emitted by the light source and greater than a critical wavelength of absorbed light corresponding to the single crystal layers, passes through the single crystal layers on the surface of the n-type SiC crystal ingot and irradiates on the surfaces of the amorphous layer, so that photo-generated hole-electron pairs are formed on the surfaces of the amorphous layer. A positive constant potential is provided to the n-type SiC crystal ingot during irradiation; photo-generated electrons on the surfaces of the amorphous layer are transferred to the cathode along current to react with the oxidant; and the silicon oxide etching solution selectively etches the surfaces of the amorphous layer provided with photo-generated holes, thereby stripping the single crystal layers and obtaining n-type SiC single crystal wafers.

Correspondingly, the present disclosure further provides a stripping method for SiC single crystal wafers, including:
  providing a semi-insulating SiC crystal ingot, and immersing the semi-insulating SiC crystal ingot in an etching solution, wherein the semi-insulating SiC crystal ingot includes an amorphous layer and a single crystal layer located on a surface of the amorphous layer, the amorphous layer is located at a predetermined depth inside the semi-insulating SiC crystal ingot, and the etching solution contains an oxidant and a silicon oxide etching solution;
  irradiating the surface of the semi-insulating SiC crystal ingot with incident light greater than a critical wavelength of absorbed light corresponding to the single crystal layer, wherein the incident light passes through the single crystal layer on the surface of the semi-insulating SiC crystal ingot and irradiates on surfaces of the amorphous layer to form photo-generated hole-electron pairs on the surfaces of the amorphous layer; and during irradiation, absorbing photo-generated electrons on the surfaces of the amorphous layer by the oxidant, and selectively etching the surfaces of the amorphous layer by the silicon oxide etching solution, thereby stripping the single crystal layer and obtaining a semi-insulating SiC single crystal wafer.

Correspondingly, the present disclosure further provides a stripping device for SiC single crystal wafers, including an electrolytic cell and a light source.

The electrolytic cell is used for containing an etching solution; a bracket is arranged inside the electrolytic cell, and is used for placing a semi-insulating SiC crystal ingot; the semi-insulating SiC crystal ingot is immersed in the etching solution, wherein the semi-insulating SiC crystal ingot includes an amorphous layer and a single crystal layer located on a surface of the amorphous layer, the amorphous layer is located at a predetermined depth inside the semi-insulating SiC crystal ingot, and the etching solution contains an oxidant and a silicon oxide etching solution.

The light source is arranged at a predetermined position above the surface of the etching solution; the incident light, which is emitted by the light source and greater than a critical wavelength of absorbed light corresponding to the single crystal layer, passes through the single crystal layer on the surface of the semi-insulating SiC crystal ingot and irradiates on surfaces of the amorphous layer, so that photo-generated hole-electron pairs are formed on the surfaces of the amorphous layer. During irradiation, the oxidant absorbs photo-generated electrons on the surfaces of the amorphous layer; and the silicon oxide etching solution selectively etches the surfaces of the amorphous layer, thereby stripping the single crystal layer and obtaining a semi-insulating SiC single crystal wafer.

The present disclosure has beneficial effects that the present disclosure provides a stripping method for SiC single crystal wafers, including: providing an n-type SiC crystal ingot, wherein the n-type SiC crystal ingot includes an amorphous layer and single crystal layers located on surfaces of the amorphous layer; immersing the n-type SiC crystal ingot in an etching solution, taking the n-type SiC crystal ingot as an anode and arranging a cathode and a reference electrode in the etching solution based on a three-electrode system; irradiating the n-type SiC crystal ingot with incident light with a specific wavelength, wherein the incident light irradiates on the surfaces of the amorphous layer to form photo-generated hole-electron pairs; providing a positive constant potential to the n-type SiC crystal ingot during irradiation, transferring photo-generated electrons on the surfaces of the amorphous layer to the cathode along current to react with the etching solution, and selectively etching the surfaces of the amorphous layer by the etching solution, thereby stripping the single crystal layers and obtaining n-type SiC single crystal wafers. The single crystal wafers obtained by the present disclosure have no damage layer or stress residue on surfaces or sub-surfaces, and are simple in operation and low in cost.

The present disclosure provides a stripping method for SiC single crystal wafers, including: providing a semi-insulating SiC crystal ingot, and immersing the semi-insulating SiC crystal ingot in an etching solution, wherein the semi-insulating SiC crystal ingot includes an amorphous layer and a single crystal layer located on a surface of the amorphous layer, and the amorphous layer is located at a predetermined depth inside the semi-insulating SiC crystal ingot; irradiating the semi-insulating SiC crystal ingot with incident light with a specific wavelength, wherein the incident light passes through the single crystal layer on the surface of the semi-insulating SiC crystal ingot and irradiates on surfaces of the amorphous layer to form photo-generated hole-electron pairs on the surfaces of the amorphous layer; and selectively etching the surfaces of the amorphous layer provided with the photo-generated hole-electron pairs by the etching solution, thereby stripping the single crystal layer and obtaining a semi-insulating SiC single crystal wafer. According to the present disclosure, the semi-insulating SiC single crystal wafers controllable in thickness can be obtained without subsequent thinning and grinding treatment; and the obtained single crystal wafers have no damage layer or stress residue on surfaces or sub-surfaces, and are simple in operation and low in cost.

DETAILED DESCRIPTION OF THE INVENTION

Technical schemes in embodiments of the present disclosure will be described clearly and completely with reference to the accompanying drawings in the embodiments of the present disclosure. Apparently, the described embodiments are only a part of the embodiments of the present disclosure and not all of the embodiments. All other embodiments obtained by those ordinary skilled in the art without contributing creative labor based on the embodiments of the present disclosure will fall within a protection scope of the present disclosure.

Figure 1:
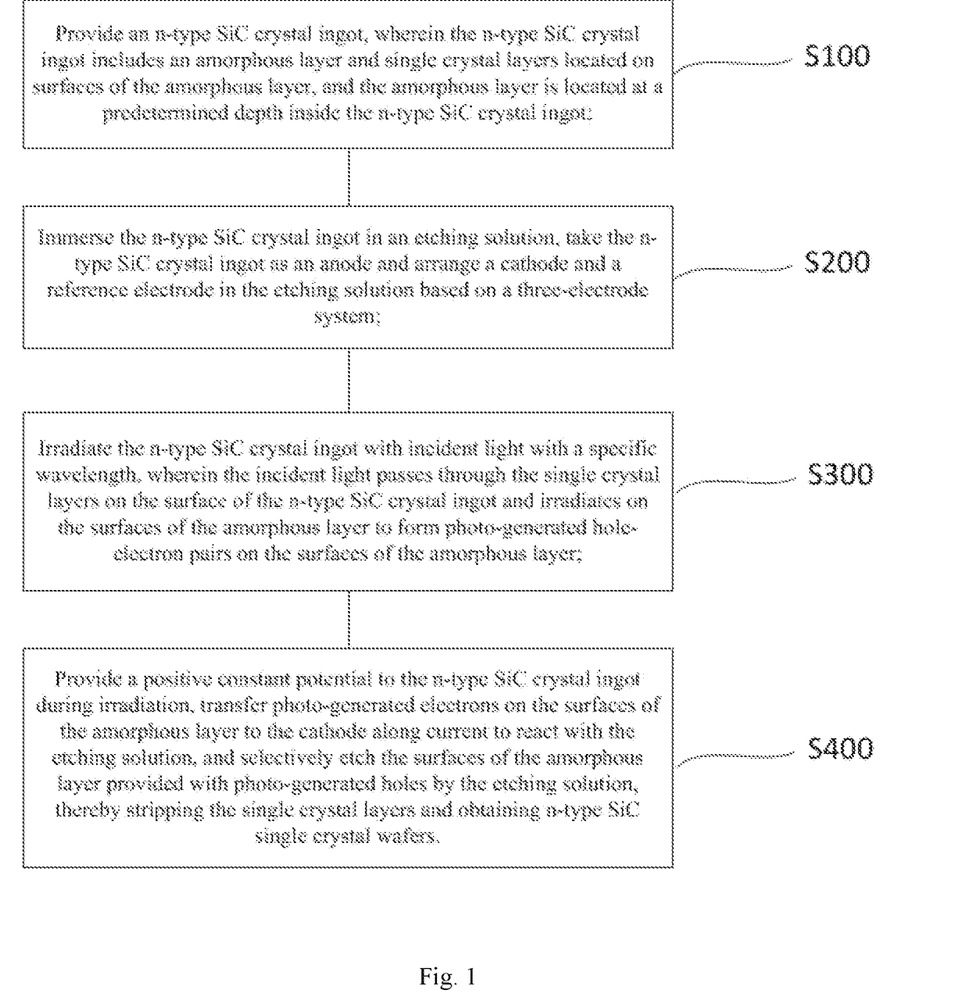
FIG. 1 is a schematic diagram of steps when an n-type SiC crystal ingot is provided in a stripping method for SiC single crystal wafers according to an embodiment of the present disclosure.

Referring to FIG. 1, the present embodiment provides a technical scheme: a stripping method for SiC single crystal wafers, including the following steps:

S100: providing an n-type SiC crystal ingot, wherein the n-type SiC crystal ingot includes an amorphous layer and single crystal layers located on surfaces of the amorphous layer, and the amorphous layer is located at a predetermined depth inside the n-type SiC crystal ingot;

S200: immersing the n-type SiC crystal ingot in an etching solution, taking the n-type SiC crystal ingot as an anode and arranging a cathode and a reference electrode in the etching solution based on a three-electrode system;

S300: irradiating the n-type SiC crystal ingot with incident light with a specific wavelength, wherein the incident light passes through the single crystal layers on the surface of the n-type SiC crystal ingot and irradiates on the surfaces of the amorphous layer to form photo-generated hole-electron pairs on the surfaces of the amorphous layer; and S400: providing a positive constant potential to the n-type SiC crystal ingot during irradiation, transferring photo-generated electrons on the surfaces of the amorphous layer to the cathode along current to react with the etching solution, and selectively etching the surfaces of the amorphous layer provided with photo-generated holes by the etching solution, thereby stripping the single crystal layers and obtaining n-type SiC single crystal wafers.

Figure 2:
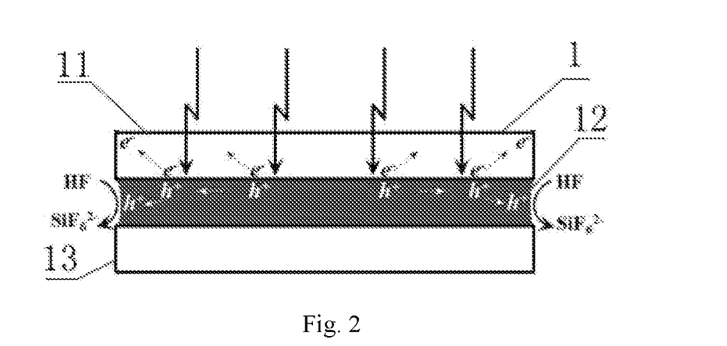
FIG. 2 is a structural schematic diagram of an n-type SiC crystal ingot in a stripping method for SiC single crystal wafers according to an embodiment of the present disclosure.

FIG. 2 is a schematic diagram of an n-type SiC crystal ingot; the n-type SiC crystal ingot has a thickness of about 1000 μm, and include an amorphous layer 12 and single crystal layers respectively located on two surfaces of the amorphous layer; the amorphous layer 12 is located at a predetermined depth inside the n-type SiC crystal ingot and penetrates through a cross section of the n-type SiC crystal ingot; and single crystal layers specifically include a first single crystal layer 11 located on an upper surface of the amorphous layer 12 and a second single crystal layers 13 located on a lower surface of the amorphous layer 12. A direction indicated by the arrow is an irradiation direction of incident light; the amorphous layer has a thickness of about 50 μm; the amorphous layer 12 contains amorphous silicon, amorphous carbon and amorphous SiC; and band gaps corresponding to amorphous silicon, amorphous carbon and amorphous SiC are all smaller than that of single crystal SiC.

The step of taking the n-type SiC crystal ingot as an anode and arranging a cathode and a reference electrode in the etching solution based on a three-electrode system includes: taking the n-type SiC crystal ingot as a working electrode and arranging a counter electrode and a reference electrode in the etching solution based on the three-electrode system, wherein the working electrode is an anode; the counter electrode is a cathode; a voltage output end is respectively connected with one end of the anode and one end of the reference electrode; and one end of the cathode is connected with a voltage input end.

Figure 3:
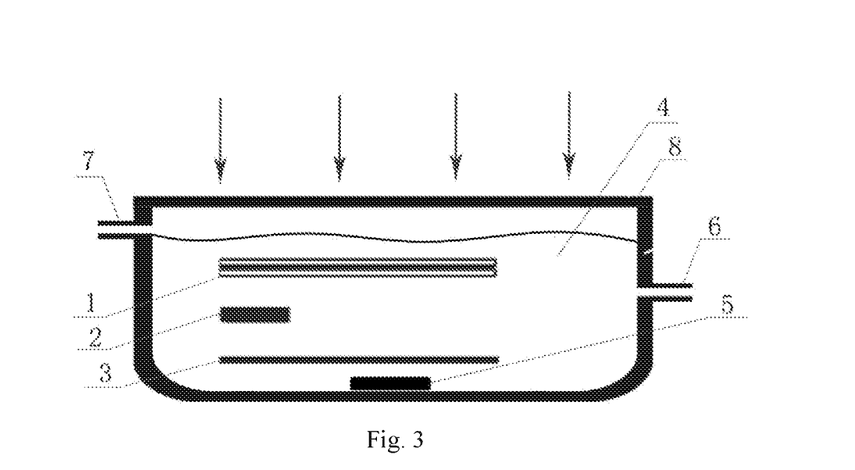
FIG. 3 is a structural schematic diagram when an n-type SiC crystal ingot is provided in a stripping device for SiC single crystal wafers according to an embodiment of the present disclosure.
Figure 4:
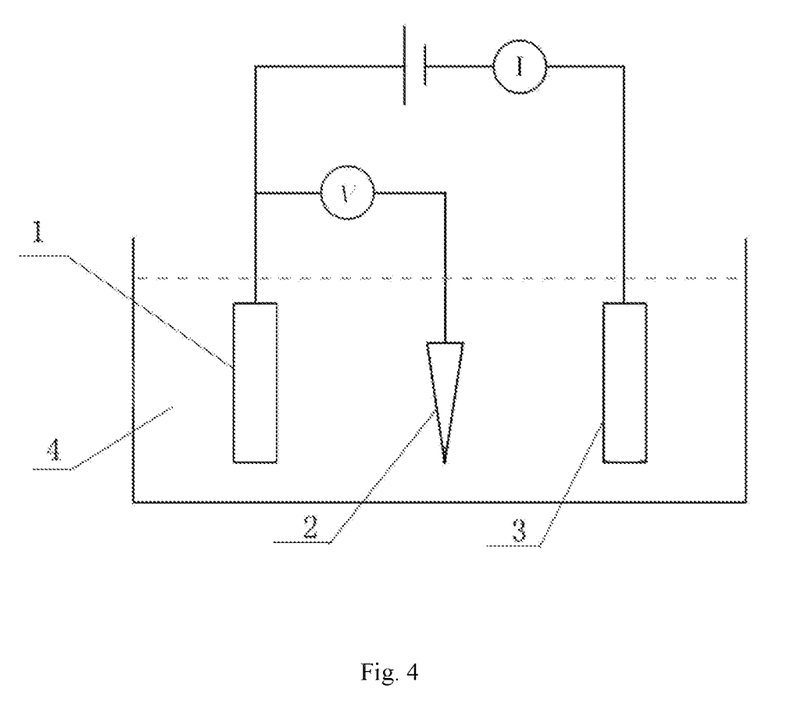
FIG. 4 is a structural schematic diagram of a three-electrode system when an n-type SiC crystal ingot is provided in a stripping device for SiC single crystal wafers according to an embodiment of the present disclosure.

As shown in FIG. 3, the n-type SiC crystal ingot 1, the counter electrode 3 and the reference electrode 2 are all immersed in the etching solution 4. As shown in FIG. 4, one end of the n-type SiC crystal ingot 1 is respectively connected with the voltage output end and one end of a voltmeter; the other end of the voltmeter is connected with one end of the reference electrode 2; one end of the counter electrode 3 is connected with one end of an ammeter; and the other end of the ammeter is connected with the voltage input end. In the present embodiment, the three-electrode system is used for photoelectrochemical etching. During etching, the etching solution should simultaneously immerse three electrodes, i.e., the working electrode, the reference electrode and the counter electrode should all be immersed in the etching solution, wherein the working electrode and the counter electrode form a current loop; and the working electrode and the reference electrode form a voltage loop.

The cathode includes a metal catalyst; the metal catalyst includes a platinum net; the area of the platinum net is 1×1 cm-20×20 cm; but in other embodiments, other metal catalysts can also be used.

The etching solution contains an oxidant and a silicon oxide etching solution; and photo-generated electrons on the surfaces of the amorphous layer are transferred to the cathode along the current to react with the etching solution. The process of selectively etching the surfaces of the amorphous layer provided with photo-generated holes by the etching solution specifically includes:

Transferring photo-generated electrons on the surfaces of the amorphous layer to the cathode along the current to react with the oxidant, reacting the remaining photo-generated holes on the surfaces of the amorphous layer with Si—C and Si—Si of n-type silicon carbide on the surfaces of the amorphous layer to generate silicon oxide, and reacting the silicon oxide etching solution with silicon oxide, thereby selectively etching the surfaces of the amorphous layer.

In the present embodiment, the oxidant is hydrogen ion $H^+$; and the silicon oxide etching solution is hydrofluoric acid HF. The reaction process of transferring photo-generated electrons on the surfaces of the amorphous layer to the cathode along the current to have a reduction reaction with the oxidant includes: performing reduction reaction on $H^+$ and the photo-generated electrons $e^-$, wherein a chemical formula of the reaction is: $2H^+ + 2e^- \rightarrow H_2\uparrow$; and reacting the remaining photo-generated holes on the surfaces of the amorphous layer with Si—C and Si—Si on the surfaces of the amorphous layer to generate silicon oxide. The reaction process of reacting the silicon oxide etching solution with silicon oxide includes: reacting the remaining photo-generated holes $h^+$ on the surfaces of the amorphous layer with Si—C and Si—Si on the surfaces of the amorphous layer to generate $SiO_2$, wherein a chemical formula of the reaction between the photo-generated holes $h^+$ and Si—C is: $SiC + 4H_2O + 8h^+ \rightarrow SiO_2 + CO_2\uparrow + 8H^+$, and a chemical formula of the reaction between the photo-generated holes $h^+$ and Si—Si is: $Si + 2H_2O + 4h^+ \rightarrow SiO_2 + 4H^+$; and reacting $SiO_2$ with hydrofluoric acid HF after $SiO_2$ is generated, wherein a chemical formula of the reaction between $SiO_2$ and hydrofluoric acid HF is: $SiO_2 + 6HF \rightarrow SiF_6^{2-} + 2H_2O + 2H^+$.

It should be noted that, in the present embodiment, the oxidant, i.e., hydrogen ion H+, comes from hydrofluoric acid, because hydrofluoric acid is a weak acid and will have partial ionization in aqueous solution.

As shown in FIG. 2, when the first single crystal layer 11 is connected with the voltage output end, a moving direction of the photo-generated electrons $e^-$ is specifically that the photo-generated electrons $e^-$ in a conduction band of the amorphous layer 12 move to the upper surface of the first single crystal layer 11, while the remaining photo-generated holes $H^+$ in the amorphous layer 12 react with Si—C and Si—Si on the surfaces of the amorphous layer to generate $SiO_2$, and then $SiO_2$ reacts with hydrofluoric acid HF to generate $SiF_6^{2-}$.

The etching solution further contains absolute ethanol; and when the silicon oxide etching solution is an aqueous solution of hydrofluoric acid HF, the concentration of aqueous solution of the hydrofluoric acid HF is 3%-30%; a mass ratio of the aqueous solution of hydrofluoric acid HF to absolute ethanol is 1:0.5-1:2; and the aqueous solution of hydrofluoric acid HF and absolute ethanol are mixed according to the mass ratio to prepare an HF alcohol-water solution with a concentration of 1-20%, wherein ethanol can be considered to play a role of reducing surface tension of the etching solution, which is beneficial for the etching solution to immerse into gaps of the amorphous layer.

The stripping method for n-type SiC single crystal wafers based on photoelectrochemical etching in the present embodiment further includes: stirring the etching solution with a stirrer at a constant speed, so that the etching solution keeps a flow rate within a fixed range, and the etching solution can fully react.

In the present embodiment, a voltage of positive constant potential applied to the SiC crystal ingot is 1-8 V; a resistivity of the n-type SiC crystal ingot is 0.015-0.028 Ω·cm; a size of the n-type SiC crystal ingot is 2-8 inches; a height of the light source emitting the incident light from the surface of the etching solution is 5-10 cm; a flow rate of the etching solution is 1-5 mL/min; and a rotating speed of the stirrer is 300-500 r/min.

The step of irradiating the n-type SiC crystal ingot with incident light with a specific wavelength includes:

vertically irradiating the surface of the n-type SiC crystal ingot with incident light greater than a critical wavelength of absorbed light corresponding to the single crystal layers, wherein when the crystal form of the single crystal layers is 4H type or 6H type, the critical wavelengths of absorbed light corresponding to 4H type and 6H type are 380 nm and 410 nm, respectively.

In the present embodiment, the light source emitting the incident light includes a xenon lamp, a mercury lamp or an LED ultraviolet lamp.

To make the wavelength of the incident light reaching the surface of the n-type SiC crystal ingot greater than the critical wavelengths of the absorbed light corresponding to the single crystal layers, in the present embodiment, a filter is used for filtering between the etching solution and the light source emitting the incident light, so that the wavelength of the incident light reaching the surface of the n-type SiC crystal ingot is greater than the critical wavelengths of the absorbed light corresponding to the single crystal layers. Alternatively, an n-type SiC wafer belonging to the same crystal form as the single crystal layers is used for filtering between the etching solution and the light source emitting the incident light; the incident light passes through the n-type SiC wafer and irradiates on the surface of the n-type SiC crystal ingot; the n-type SiC wafer is used for absorbing incident light which is less than or equal to the critical wavelength of the absorbed light corresponding to the n-type SiC wafer, so that the wavelength of the incident light irradiated on the surface of the n-type SiC crystal ingot is greater than the critical wavelength of the absorbed light corresponding to the single crystal layers.

The forming process of the amorphous layer includes the following steps: focusing laser on a cut surface located at a predetermined depth of the n-type SiC crystal ingot and parallel to a base surface of the n-type SiC crystal ingot, locally heating the n-type SiC crystal ingot to generate high-density dislocations, thereby forming an amorphous layer at a predetermined depth of the n-type SiC crystal ingot, wherein the amorphous layer includes amorphous silicon, amorphous carbon and amorphous SiC.

By the stripping method for n-type SiC single crystal wafers based on photoelectrochemical etching adopted in the present embodiment, the n-type SiC single crystal wafers controllable in thickness can be obtained without thinning and grinding treatment. The single crystal wafers include 2-inch, 4-inch, 6-inch and 8-inch single crystal wafers. The single crystal wafers have no damage layer or stress residue on surfaces or sub-surfaces, have simple operation and low cost, and replace the high-cost and low-efficiency "diamond wire cutting method" adopted in the prior art.

Based on the same inventive concept, an embodiment of the present disclosure further provides a stripping device for SiC single crystal wafers, including an electrolytic cell and a light source.

The electrolytic cell is used for containing an etching solution; an installation structure is arranged in the etching solution; the installation structure is used for installing an n-type SiC crystal ingot, and a reference electrode and a cathode in a three-electrode system; one end of the n-type SiC crystal ingot is connected with a voltage output end; the cathode is connected with a voltage input end, wherein the n-type SiC crystal ingot includes an amorphous layer and single crystal layers located on surfaces of the amorphous layer; and the amorphous layer is located at a predetermined depth inside the n-type SiC crystal ingot.

The light source is arranged at a predetermined position above the surface of the etching solution; the incident light, which is emitted by the light source and has a specific wavelength, passes through the single crystal layers on the surface of the n-type SiC crystal ingot and irradiates on the surfaces of the amorphous layer, so that photo-generated hole-electron pairs are formed on the surfaces of the amorphous layer. A positive constant potential is provided to the n-type SiC crystal ingot during irradiation; photo-generated electrons on the surfaces of the amorphous layer are transferred to the cathode along current to react with the etching solution; and the etching solution selectively etches the surfaces of the amorphous layer provided with photo-generated holes, thereby stripping the single crystal layers and obtaining n-type SiC single crystal wafers.

The installation structure is used for installing the n-type SiC crystal ingot, and the reference electrode and the cathode in the three-electrode system; and one end of the n-type SiC crystal ingot and one end of the reference electrode are respectively connected with the voltage output end. The process that the cathode is connected with a voltage input end specifically includes: the installation structure is used for installing the n-type SiC crystal ingot, and a counter electrode and the reference electrode in the three-electrode system, wherein the n-type SiC crystal ingot is a working electrode and is an anode; the counter electrode is a cathode; the voltage output end is respectively connected with one end of the anode and one end of the reference electrode; and one end of the cathode is connected with the voltage input end.

To make the wavelength of the incident light reaching the surface of the n-type SiC crystal ingot greater than the critical wavelengths of the absorbed light corresponding to the single crystal layers, a filter is further arranged between the light source and the etching solution; the filter is used for filtering, so that the wavelength of the incident light reaching the surface of the n-type SiC crystal ingot is greater than the critical wavelengths of the absorbed light corresponding to the single crystal layers. Alternatively, an n-type SiC wafer belonging to the same crystal form as the single crystal layers is further arranged between the etching solution and the light source; the incident light passes through the n-type SiC wafer and irradiates on the surface of the n-type SiC crystal ingot; the n-type SiC wafer is used for absorbing incident light which is less than or equal to the critical wavelength of the absorbed light corresponding to the n-type SiC wafer, so that the wavelength of the incident light irradiated on the surface of the n-type SiC crystal ingot is greater than the critical wavelengths of the absorbed light corresponding to the single crystal layers.

As shown in FIG. 3, the SiC wafer 8 completely covers the electrolytic cell; the incident light emitted by the light source passes through the SiC wafer 8 in a direction indicated by the arrow and irradiates on the surface of the n-type SiC crystal ingot 1; and the n-type SiC crystal ingot 1, the reference electrode 2 and the metal catalyst are immersed in the etching solution.

In the present embodiment, the light source includes a xenon lamp, a mercury lamp, an LED ultraviolet lamp or the like.

In the present embodiment, the installation structure is an opening, which is used for fixing the n-type SiC crystal ingot 1, the reference electrode 2 and the metal catalyst. An etching solution inlet 6 and an etching solution outlet 7 are respectively formed in left and right sides of the electrolytic cell, wherein the height of the etching solution inlet 6 is lower than that of the etching solution outlet 7, so that the etching solution in the electrolytic cell can be conveniently replaced.

A stirrer 5 is further arranged at the bottom of the electrolytic cell; and the stirrer 5 is used for stirring the etching solution at a constant speed, so that the etching solution can keep a flow rate within a fixed range, and the etching solution can fully react.

In the present embodiment, the installation structure is made of polytetrafluoroethylene materials; and the electrolytic cell is made of polytetrafluoroethylene materials.

By the stripping method for n-type SiC single crystal wafers and the stripping device for n-type SiC single crystal wafers adopted in the present disclosure, the n-type SiC single crystal wafers controllable in thickness can be obtained without thinning and grinding treatment. The single crystal wafers include 2-inch, 4-inch, 6-inch and 8-inch single crystal wafers. The single crystal wafers have no damage layer or stress residue on surfaces or subsurfaces, have simple operation and low cost, and replace the high-cost and low-efficiency "diamond wire cutting method" adopted in the prior art.

Figure 5:
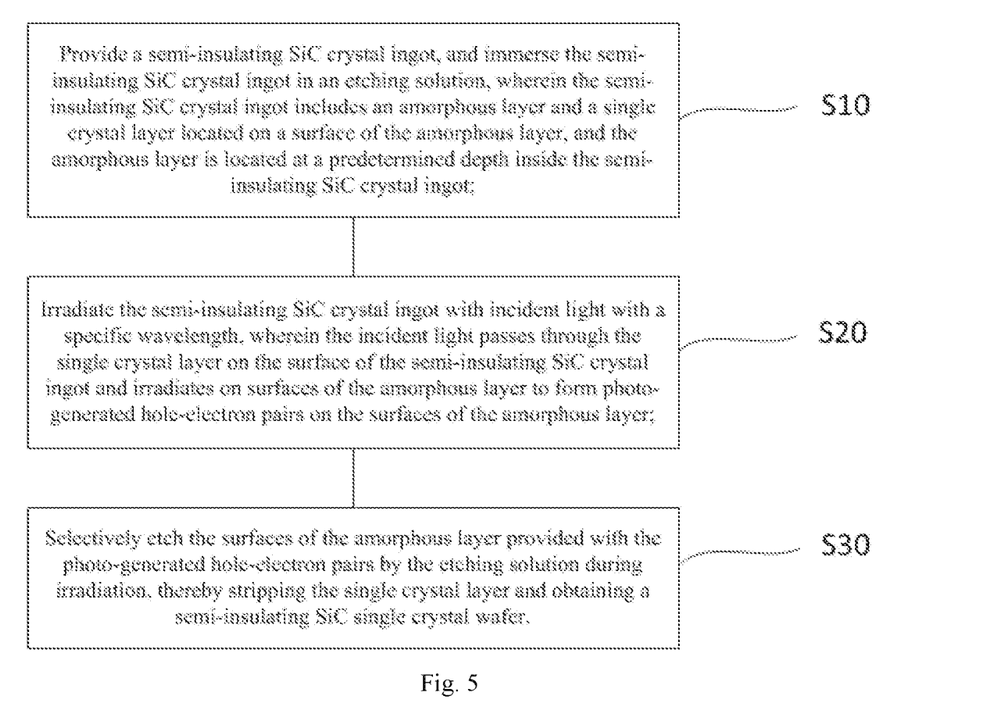
FIG. 5 is a schematic diagram of steps when an n-type SiC crystal ingot is provided in a stripping method for SiC single crystal wafers according to an embodiment of the present disclosure.

Based on the same inventive concept, an embodiment of the present disclosure further provides a stripping method for SiC single crystal wafers, as shown in FIG. 5, including the following steps:

S10: providing a semi-insulating SiC crystal ingot, and immersing the semi-insulating SiC crystal ingot in an etching solution, wherein the semi-insulating SiC crystal ingot includes an amorphous layer and a single crystal layer located on a surface of the amorphous layer, and the amorphous layer is located at a predetermined depth inside the semi-insulating SiC crystal ingot;

S20: irradiating the semi-insulating SiC crystal ingot with incident light with a specific wavelength, wherein the incident light passes through the single crystal layer on the surface of the semi-insulating SiC crystal ingot and irradiates on surfaces of the amorphous layer to form photo-generated hole-electron pairs on the surfaces of the amorphous layer; and S30: selectively etching the surfaces of the amorphous layer provided with the photo-generated hole-electron pairs by the etching solution during irradiation, thereby stripping the single crystal layer and obtaining a semi-insulating SiC single crystal wafer.

Figure 6:
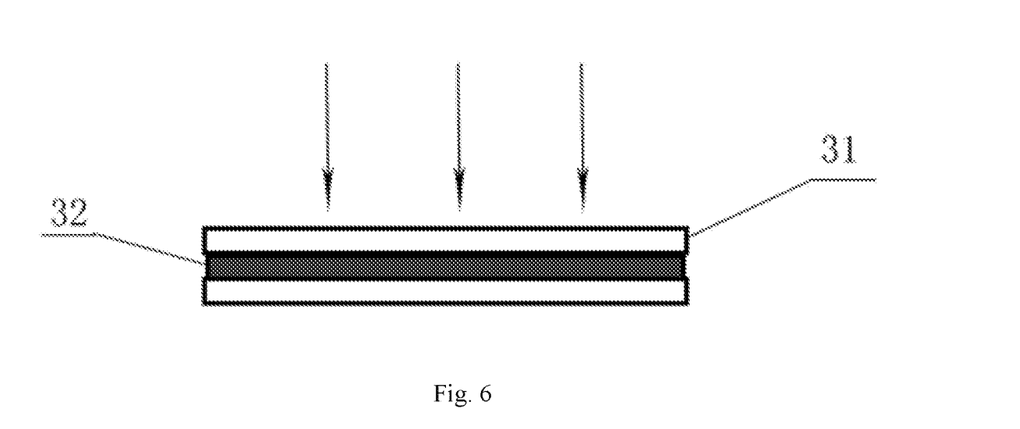
FIG. 6 is a structural schematic diagram of a semi-insulating SiC crystal ingot in a stripping method for SiC single crystal wafers according to an embodiment of the present disclosure.

FIG. 6 is a schematic diagram of a semi-insulating SiC crystal ingot; the semi-insulating SiC crystal ingot has a thickness of about 450 μm, and includes a single crystal layer 31, an amorphous layer 32 and a structure below; and the single crystal layer 31 is located above a surface of the amorphous layer 32. A direction indicated by the arrow is an irradiation direction of incident light; the amorphous layer has a thickness of about 50 μm; the amorphous layer 32 contains amorphous silicon, amorphous carbon and amorphous SiC; and band gaps corresponding to amorphous silicon, amorphous carbon and amorphous SiC are all smaller than that of single crystal SiC.

The step of selectively etching the surfaces of the amorphous layer provided with the photo-generated hole-electron pairs by the etching solution includes: absorbing photo-generated electrons on the surfaces of the amorphous layer by the etching solution, damaging Si—C and Si—Si on the surface of the amorphous layer by the remaining photo-generated holes on the surface of the amorphous layer, and selectively etching the damaged surface of the amorphous layer by the etching solution.

The etching solution contains an oxidant and a silicon oxide etching solution. The step of selectively etching the surfaces of the amorphous layer provided with the photo-generated hole-electron pairs by the etching solution includes: absorbing photo-generated electrons on the surfaces of the amorphous layer by the etching solution to have an oxidation reaction, reacting the remaining photo-generated holes on the surfaces of the amorphous layer with Si—C and Si—Si of silicon carbide on the surfaces of the amorphous layer to generate silicon oxide, and reacting a silicon oxide etching solution with silicon oxide, thereby selectively etching the surfaces of the amorphous layer.

The silicon oxide etching solution contains hydrofluoric acid HF; and the remaining photo-generated holes on the surfaces of the amorphous layer react with Si—C and Si—Si of silicon carbide on the surfaces of the amorphous layer to generate silicon oxide. The reaction process of reacting the silicon oxide etching solution with silicon oxide includes:

Reacting the remaining photo-generated holes $h^+$ on the surfaces of the amorphous layer with Si—C and Si—Si on the surfaces of the amorphous layer to generate $SiO_2$, wherein a chemical formula of the reaction between the photo-generated holes $h^+$ and Si—C is: $SiC+2H_2O+4h^++2O^-\rightarrow SiO_2+CO_2\uparrow+4H^+$; and a chemical formula of the reaction between the photo-generated holes $h^+$ and Si—Si is: $Si+2H_2O+4h^+\rightarrow SiO_2+4H^+$.

After $SiO_2$ is generated, $SiO_2$ reacts with HF hydrofluoric acid, wherein a chemical formula of the reaction between $SiO_2$ and HF hydrofluoric acid is: $SiO_2+6HF\rightarrow SiF_6^{2-}+2H_2O+2H^+$.

According to the above decomposition formulae, an upper surface and a lower surface of the amorphous layer will be stripped, i.e., the amorphous layer will be decomposed to finally leave only the single crystal layer and the structure below.

The oxidant includes chromium trioxide $CrO_3$, hydrogen peroxide $H_2O_2$ or potassium persulfate $K_2S_2O_8$.

When the oxidant is chromium trioxide $CrO_3$ and the silicon oxide etching solution is hydrofluoric acid HF, a molar concentration of hydrofluoric acid HF is 5-10 mol/L; and the molar concentration ratio of hydrofluoric acid HF to chromium trioxide $CrO_3$ is 5:1-25:1.

The step of irradiating the semi-insulating SiC crystal ingot with incident light with a specific wavelength includes: vertically irradiating the surface of the semi-insulating SiC crystal ingot with incident light greater than a critical wavelength of absorbed light corresponding to the single crystal layer.

The crystal form of the single crystal layer is 4H type or 6H type, wherein the critical wavelengths of absorbed light corresponding to 4H type and 6H type are 380 nm and 410 nm, respectively. Therefore, when the single crystal layer is a 4H-type SiC single crystal, incident light with a wavelength greater than 380 nm is used for irradiating on the surface of the SiC crystal ingot; and when the single crystal layer is a 6H-type SiC single crystal, incident light with a wavelength greater than 410 nm is used for irradiating on the surface of the SiC crystal ingot.

Specifically, the critical wavelengths of absorbed light corresponding to 4H-type and 6H-type SiC single crystals are 380 nm and 410 nm, respectively. Light ≤380 nm (or ≤410 nm) can be absorbed by semi-insulating 4H-type (or 6H-type) SiC single crystals, to form photo-generated hole-electron pairs in a semi-insulating SiC wafer. However, light >380 nm (or >410 nm) cannot be absorbed by 4H-type (or 6H-type) SiC single crystals, but can be absorbed by the corresponding amorphous layer to generate photo-generated hole-electron pairs and react with etching solution because the band gap of the amorphous layer is smaller than that of single crystal SiC. Therefore, selective photoetching can be realized by selecting the wavelength range of the incident light.

The stripping method for semi-insulating SiC single crystal wafers in the present embodiment further includes: stirring the etching solution with a stirrer at a constant speed, so that the etching solution keeps a flow rate within a fixed range. Specifically, the etching solution continuously flows into the electrolytic cell through an etching solution inlet and flows out of the electrolytic cell through an etching solution outlet; and the stirrer is arranged at the bottom of the electrolytic cell to stir at a constant speed, thereby jointly promoting material transfer during photoetching.

A resistivity of the semi-insulating SiC crystal ingot is $10^5$-$10^8$Ω·cm; a size of the semi-insulating SiC crystal ingot is 2-8 inches; a height of the light source emitting the incident light from the surface of the etching solution is 5-10 cm; a flow rate of the etching solution is 1-5 mL/min; and a rotating speed of the stirrer is 300-500 r/min.

The light source emitting the incident light includes a 350 W xenon lamp; and the wavelength of the incident light emitted by the xenon lamp is 350 nm-780 nm. In other embodiments, other light sources, such as a mercury lamp and an LED ultraviolet lamp, can be used as alternative light sources.

To make the wavelength of the incident light reaching the surface of the semi-insulating SiC crystal ingot greater than the critical wavelength of the absorbed light corresponding to the single crystal layer, a filter is used for filtering between the etching solution and the light source emitting the incident light, so that the wavelength of the incident light reaching the surface of the semi-insulating SiC crystal ingot is greater than the critical wavelength of the absorbed light corresponding to the single crystal layer. Alternatively, a semi-insulating SiC wafer belonging to the same crystal form as the single crystal layer is used for filtering between the etching solution and the light source emitting the incident light; the incident light passes through the semi-insulating SiC wafer and irradiates on the surface of the semi-insulating SiC crystal ingot; the semi-insulating SiC wafer is used for absorbing incident light which is less than or equal to the critical wavelength of the absorbed light corresponding to the semi-insulating SiC wafer, so that the wavelength of the incident light irradiated on the surface of the semi-insulating SiC crystal ingot is greater than the critical wavelength of the absorbed light corresponding to the single crystal layer.

For example, if the crystal form of the single crystal layer is 4H type, the crystal form of the semi-insulating SiC wafer used should also be 4H type; and if the crystal form of the single crystal layer is 6H type, the crystal form of the semi-insulating SiC wafer used should also be 6H type.

Taking 4H-type SiC wafer as an example, silicon carbide in the 4H-type SiC wafer is single crystal; and the 4H-type SiC single crystal can absorb the incident light less than or equal to 380 nm to generate photo-generated hole-electron pairs. The lifetime of photo-generated electrons and photo-generated holes is very short, at picosecond level. Because no oxidant is present around the semi-insulating SiC wafer, the photo-generated electrons will quickly compound with the photo-generated holes and disappear, thereby absorbing and filtering the light emitted by the xenon lamp. The incident light not absorbed by the 4H-type SiC wafer, i.e., the incident light with a wavelength greater than 380 nm, will further pass through the etching solution and reach the surface of the 4H-type SiC crystal ingot pretreated by laser, then pass through the single crystal layer on the surface of the semi-insulating SiC crystal ingot and finally reach the surfaces of the amorphous layer, thereby etching the amorphous layer and finally stripping the semi-insulating SiC single crystal wafer; and the surface of the obtained single crystal wafer has no stress residue.

The forming process of the amorphous layer includes the following steps: focusing laser on a cut surface located at a predetermined depth of the semi-insulating SiC and parallel to a base surface of the semi-insulating SiC crystal ingot, locally heating the semi-insulating SiC crystal ingot to generate high-density dislocations, thereby forming an amorphous layer at a predetermined depth of the semi-insulating SiC crystal ingot, wherein the amorphous layer penetrates through a cross section of the semi-insulating SiC crystal ingot, and includes amorphous silicon, amorphous carbon and amorphous SiC.

It should be noted that the technology of forming an amorphous surface by laser cutting pretreatment in the present embodiment belongs to the prior art, and thus will not be described in detail in the present embodiment.

Based on the same inventive concept, an embodiment of the present disclosure further provides a stripping device for SiC single crystal wafers, including an electrolytic cell and a light source.

The electrolytic cell is used for containing an etching solution; a bracket is arranged inside the electrolytic cell, and is used for placing a semi-insulating SiC crystal ingot; the semi-insulating SiC crystal ingot is immersed in the etching solution, wherein the semi-insulating SiC crystal ingot includes an amorphous layer and a single crystal layer located on a surface of the amorphous layer, and the amorphous layer is located at a predetermined depth inside the semi-insulating SiC crystal ingot.

The light source is arranged at a predetermined position above the surface of the etching solution; the incident light, which is emitted by the light source and has a specific wavelength, passes through the single crystal layer on the surface of the semi-insulating SiC crystal ingot and irradiates on surfaces of the amorphous layer, so that photo-generated hole-electron pairs are formed on the surface of the amorphous layer. The etching solution selectively etches the surface of the amorphous layer provided with the photo-generated hole-electron pairs during irradiation, thereby stripping the single crystal layer and obtaining a semi-insulating SiC single crystal wafer.

Figure 7:
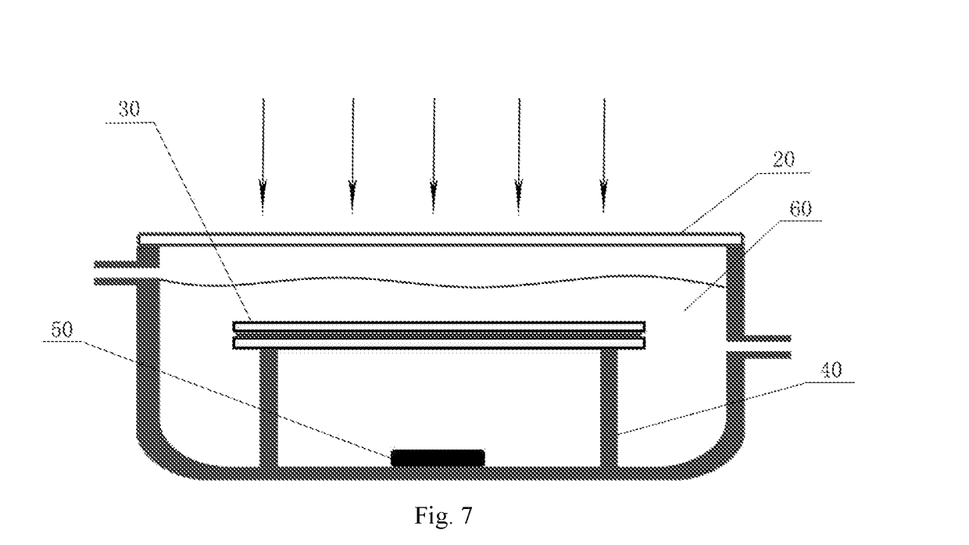
FIG. 7 is a structural schematic diagram when a semi-insulating SiC crystal ingot is provided in a stripping device for SiC single crystal wafers according to an embodiment of the present disclosure.

Specifically, as shown in FIG. 7, the electrolytic cell is internally provided with a bracket 40 and filled with an etching solution 60. The bracket 40 is used for placing a semi-insulating SiC crystal ingot 30; and the semi-insulating SiC crystal ingot 30 is immersed in the etching solution 60. The light source is arranged at a predetermined position above the etching solution 60; and incident light emitted by the light source passes through the single crystal layer on the surface of the semi-insulating SiC crystal ingot in a direction indicated by the arrow and irradiates on surfaces of the amorphous layer, wherein the wavelength of the incident light is greater than a critical wavelength of absorbed light corresponding to the single crystal layer.

The bracket is a polytetrafluoroethylene bracket; and the electrolytic cell is a polytetrafluoroethylene electrolytic cell.

The light source includes a xenon lamp, a mercury lamp and an LED ultraviolet lamp.

To make the wavelength of the incident light reaching the surface of the semi-insulating SiC crystal ingot greater than the critical wavelength of the absorbed light corresponding to the single crystal layer, a filter is further arranged between the etching solution and the light source; the filter is used for filtering, so that the wavelength of the incident light reaching the surface of the semi-insulating SiC crystal ingot is greater than the critical wavelength of the absorbed light corresponding to the single crystal layer. Alternatively, a semi-insulating SiC wafer 20 belonging to the same crystal form as the single crystal layer is further arranged between the etching solution and the light source; the incident light passes through the semi-insulating SiC wafer 20 and irradiates on the surface of the semi-insulating SiC crystal ingot 30; the semi-insulating SiC wafer 20 is used for absorbing incident light which is less than or equal to the critical wavelength of the absorbed light corresponding to the semi-insulating SiC wafer 20, so that the wavelength of the incident light irradiated on the surface of the semi-insulating SiC crystal ingot 30 is greater than the critical wavelength of the absorbed light corresponding to the single crystal layer.

An etching solution inlet and an etching solution outlet are respectively formed in left and right sides of the electrolytic cell, wherein the height of the etching solution inlet is lower than that of the etching solution outlet.

A stirrer 50 is further arranged at the bottom of the electrolytic cell; and the stirrer 50 is used for stirring the etching solution 60 at a constant speed, so that the etching solution 60 can keep a flow rate within a fixed range.

By the stripping method for semi-insulating SiC single crystal wafers and the stripping device for semi-insulating SiC single crystal wafers adopted in the present disclosure, the semi-insulating SiC single crystal wafers controllable in thickness can be obtained without thinning and grinding treatment. The single crystal wafers include 2-inch, 4-inch, 6-inch and 8-inch single crystal wafers. The single crystal wafers have no damage layer or stress residue on surfaces or sub-surfaces, have simple operation and low cost, and replace the high-cost and low-efficiency "diamond wire cutting method" adopted in the prior art.

Although the present disclosure is disclosed as above by using the preferred embodiments, the preferred embodiments are not used for limiting the present disclosure. Any one of those skilled in the art can make possible changes and amendments to the technical schemes of the present disclosure by using the methods and technical contents disclosed above without departing from the spirit and scope of the present disclosure. Therefore, any simple amendments, equivalent changes and modifications made to the above embodiments according to the technical essence of the present disclosure without departing from the content of the technical schemes of the present disclosure fall within the protection scope of the technical schemes of the present disclosure.

The invention claimed is:

1. A stripping method for SiC single crystal wafers, comprising:
    providing an n-type SiC crystal ingot, wherein the n-type SiC crystal ingot comprises an amorphous layer and single crystal layers located on surfaces of the amorphous layer, and the amorphous layer is located at a predetermined depth inside the n-type SiC crystal ingot;
    immersing the n-type SiC crystal ingot in an etching solution, taking the n-type SiC crystal ingot as an anode and arranging a cathode and a reference electrode in the etching solution based on a three-electrode system, wherein the etching solution contains an oxidant and a silicon oxide etching solution;
    irradiating the surface of the n-type SiC crystal ingot with incident light greater than a critical wavelength of absorbed light corresponding to the single crystal layers, wherein the incident light passes through the single crystal layers on the surface of the n-type SiC crystal ingot and irradiates on the surfaces of the amorphous layer to form photo-generated hole-electron pairs on the surfaces of the amorphous layer;
    providing a positive constant potential to the n-type SiC crystal ingot during irradiation, transferring photo-generated electrons on the surfaces of the amorphous layer to the cathode along current to react with the oxidant, and selectively etching the surfaces of the amorphous layer provided with photo-generated holes by the silicon oxide etching solution, thereby stripping the single crystal layers and obtaining n-type SiC single crystal wafers.

2. The stripping method for SiC single crystal wafers according to claim 1, wherein the step of taking the n-type SiC crystal ingot as an anode and arranging a cathode and a reference electrode in the etching solution based on a three-electrode system comprises: taking the n-type SiC crystal ingot as a working electrode and arranging a counter electrode and a reference electrode in the etching solution based on the three-electrode system, wherein the working electrode is an anode; the counter electrode is a cathode; a voltage output end is respectively connected with one end of the anode and one end of the reference electrode; and one end of the cathode is connected with a voltage input end.

3. The stripping method for SiC single crystal wafers according to claim 1, wherein the process of transferring photo-generated electrons on the surfaces of the amorphous layer to the cathode along current to react with the oxidant, and selectively etching the surfaces of the amorphous layer provided with photo-generated holes by the silicon oxide etching solution specifically comprises:
    transferring photo-generated electrons on the surfaces of the amorphous layer to the cathode along the current to react with the oxidant, reacting the remaining photo-generated holes on the surfaces of the amorphous layer with Si—C and Si—Si of n-type silicon carbide on the surfaces of the amorphous layer to generate silicon oxide, and reacting the silicon oxide etching solution with silicon oxide, thereby selectively etching the surfaces of the amorphous layer.

4. The stripping method for SiC single crystal wafers according to claim 3, wherein the oxidant is hydrogen ion $H^+$; the silicon oxide etching solution is hydrofluoric acid HF; the reaction process of transferring photo-generated electrons on the surfaces of the amorphous layer to the cathode along the current to have a reduction reaction with the oxidant comprises: performing reduction reaction on $H^+$ and the photo-generated electrons $e^-$, wherein a chemical formula of the reaction is:

$2H^+ + 2e^- \rightarrow H^2\uparrow$; and reacting the remaining photo-generated holes on the surfaces of the amorphous layer with Si—C and Si—Si on the surfaces of the amorphous layer to generate silicon oxide; the reaction process of reacting the silicon oxide etching solution with silicon oxide comprises: reacting the remaining photo-generated holes $h^+$ on the surfaces of the amorphous layer with Si—C and Si—Si on the surfaces of the amorphous layer to generate $SiO_2$, wherein a chemical formula of the reaction between the photo-generated holes $h^+$ and Si—C is:

$SiC + 4H_2O + 8h^+ \rightarrow SiO_2 + CO_2\uparrow + 8H^+$, and a chemical formula of the reaction between the photo-generated holes $h^+$ and Si—Si is: $Si + 2H_2O + 4h^+ \rightarrow SiO_2 + 4H^+$; and reacting $SiO_2$ with hydrofluoric acid HF after $SiO_2$ is generated, wherein a chemical formula of the reaction between $SiO_2$ and hydrofluoric acid HF is: $SiO_2 + 6HF \rightarrow SiF_6^{2-} + 2H_2O + 2H^+$.

5. The stripping method for SiC single crystal wafers according to claim 1, wherein the step of irradiating the surface of the n-type SiC crystal ingot with incident light greater than a critical wavelength of absorbed light corresponding to the single crystal layers comprises: vertically irradiating the surface of the n-type SiC crystal ingot with incident light greater than a critical wavelength of absorbed light corresponding to the single crystal layers, wherein when the crystal form of the single crystal layers is 4H type or 6H type, the critical wavelengths of absorbed light corresponding to 4H type and 6H type are 380 nm and 410 nm, respectively.

6. The stripping method for SiC single crystal wafers according to claim 1, further comprising filtering by a filter between the etching solution and the light source emitting the incident light, so that the wavelength of the incident light reaching the surface of the n-type SiC crystal ingot is greater than the critical wavelengths of the absorbed light corresponding to the single crystal layers;

alternatively, filtering by an n-type SiC wafer belonging to the same crystal form as the single crystal layers between the etching solution and the light source emitting the incident light, wherein the incident light passes through the n-type SiC wafer and irradiates on the surface of the n-type SiC crystal ingot; the n-type SiC wafer is used for absorbing incident light which is less than or equal to the critical wavelength of the absorbed light corresponding to the n-type SiC wafer, so that the wavelength of the incident light irradiated on the surface of the n-type SiC crystal ingot is greater than the critical wavelength of the absorbed light corresponding to the single crystal layers.

* * * * *